(12) United States Patent
Lim et al.

(10) Patent No.: US 8,173,507 B2
(45) Date of Patent: May 8, 2012

(54) METHODS OF FORMING INTEGRATED CIRCUITRY COMPRISING CHARGE STORAGE TRANSISTORS

(75) Inventors: Chan Lim, Boise, ID (US); Jennifer Lequn Liu, Boise, ID (US); Brian Dolan, Boise, ID (US); Saurabh Keshav, Boise, ID (US); Hongbin Zhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 87 days.

(21) Appl. No.: 12/820,214

(22) Filed: Jun. 22, 2010

(65) Prior Publication Data
US 2011/0312171 A1    Dec. 22, 2011

(51) Int. Cl.
*H01L 21/8247* (2006.01)
(52) U.S. Cl. ............................ 438/261; 257/E21.179
(58) Field of Classification Search .......... 438/257–267, 438/528, 706, 745
See application file for complete search history.

(56) References Cited

U.S. PATENT DOCUMENTS

| | | | |
|---|---|---|---|
| 5,923,046 A | 7/1999 | Tezuka | |
| 6,346,725 B1 | 2/2002 | Ma | |
| 6,541,815 B1 | 4/2003 | Mandelman | |
| 6,670,240 B2 | 12/2003 | Ogura | |
| 6,699,753 B2 | 3/2004 | Ma | |
| 6,764,898 B1 * | 7/2004 | En et al. ......................... | 438/240 |
| 6,822,254 B1 | 11/2004 | Lovejoy | |
| 6,825,084 B2 | 11/2004 | Ogura | |
| 6,998,658 B2 | 2/2006 | Ogura | |
| 7,052,962 B1 | 5/2006 | Lovejoy | |
| 7,132,370 B2 | 11/2006 | Paraschiv | |
| 7,479,428 B2 * | 1/2009 | Forbes .......................... | 438/261 |
| 7,642,163 B2 * | 1/2010 | Rao et al. ...................... | 438/260 |
| 7,670,905 B2 * | 3/2010 | Kiehlbauch ................... | 438/257 |
| 7,700,438 B2 * | 4/2010 | Liu et al. ....................... | 438/261 |
| 8,039,342 B2 * | 10/2011 | Griebenow et al. ........... | 438/231 |
| 2001/0021563 A1 | 9/2001 | Ma | |
| 2005/0059213 A1 * | 3/2005 | Steimle et al. ................ | 438/260 |

\* cited by examiner

*Primary Examiner* — Savitr Mulpuri
(74) *Attorney, Agent, or Firm* — Wells St. John, P.S.

(57) ABSTRACT

Methods include forming a charge storage transistor gate stack over semiconductive material. One such stack includes a tunnel dielectric, charge storage material over the tunnel dielectric, a high-k dielectric over the charge storage material, and conductive control gate material over the high-k dielectric. The stack is etched at least to the tunnel dielectric to form a plurality of charge storage transistor gate lines over the semiconductive material. Individual of the gate lines have laterally projecting feet which include the high-k dielectric. After etching the stack to form the gate lines, ions are implanted into an implant region which includes the high-k dielectric of the laterally projecting feet. The ions are chemically inert to the high-k dielectric. The ion implanted high-k dielectric of the projecting feet is etched selectively relative to portions of the high-k dielectric outside of the implant region.

23 Claims, 9 Drawing Sheets

METHODS OF FORMING INTEGRATED CIRCUITRY COMPRISING CHARGE STORAGE TRANSISTORS

TECHNICAL FIELD

Embodiments disclosed herein pertain to methods of forming integrated circuitry comprising charge storage transistors.

BACKGROUND

The fabrication of integrated circuitry forms electronic devices, such as transistors, resistors, and capacitors. Such fabrication typically employs deposition of various materials over a substrate, followed by forming mask patterns thereover. The mask patterns may be used to etch the materials into desired shapes of the electronic devices or components of the electronic devices. One example component is a gate construction of a charge storage transistor. By way of example, such might be used in memory circuitry to provide data storage for electronic systems. One example type of memory is a non-volatile memory known as flash. Flash memory is a type of EEPROM (electrically-erasable programmable read-only memory) that may be erased and reprogrammed in blocks. Many modern personal computers have BIOS stored on a flash memory chip. Flash memory is also commonly used in wireless electronic devices as it enables the manufacturer to support new communication protocols as they become standardized, and provides the ability to remotely upgrade the devices for enhanced features.

BRIEF DESCRIPTION OF THE DRAWINGS

FIG. 6 is a diagrammatic sectional view of a substrate fragment in process of forming integrated circuitry in accordance with an embodiment of the invention, and is an alternate to the processing depicted by FIG. 2.

FIG. 7 is a diagrammatic sectional view of a substrate fragment in process of forming integrated circuitry in accordance with an embodiment of the invention.

FIG. 8 is a simplified block diagram of a memory system in accordance with an embodiment.

DETAILED DESCRIPTION OF EXAMPLE EMBODIMENTS

Embodiments of the invention encompass methods of forming integrated circuitry which include formation of transistor gates having charge storage structures (e.g., floating gates, charge traps, or the like) that are capable of being programmed into at least two different states. The transistor gates include control gate structures formed over charge storage structures. The control gate structures may be incorporated with multiple transistors, and the control gate structures may be individually associated with a single transistor. The charge storage structures may be immediately adjacent a tunnel dielectric. The charge storage structures comprise material capable of retaining/storing/trapping charge. One example charge storage material comprises metallic nanoparticles embedded in a high-k dielectric, for example as described below. The amount of charge stored in the charge storage structures determines a programming state. In contrast, standard field effect transistors (FETs) do not utilize charge storage structures as part of their gates, but instead have a conductive gate directly over gate dielectric material.

Figure 1:
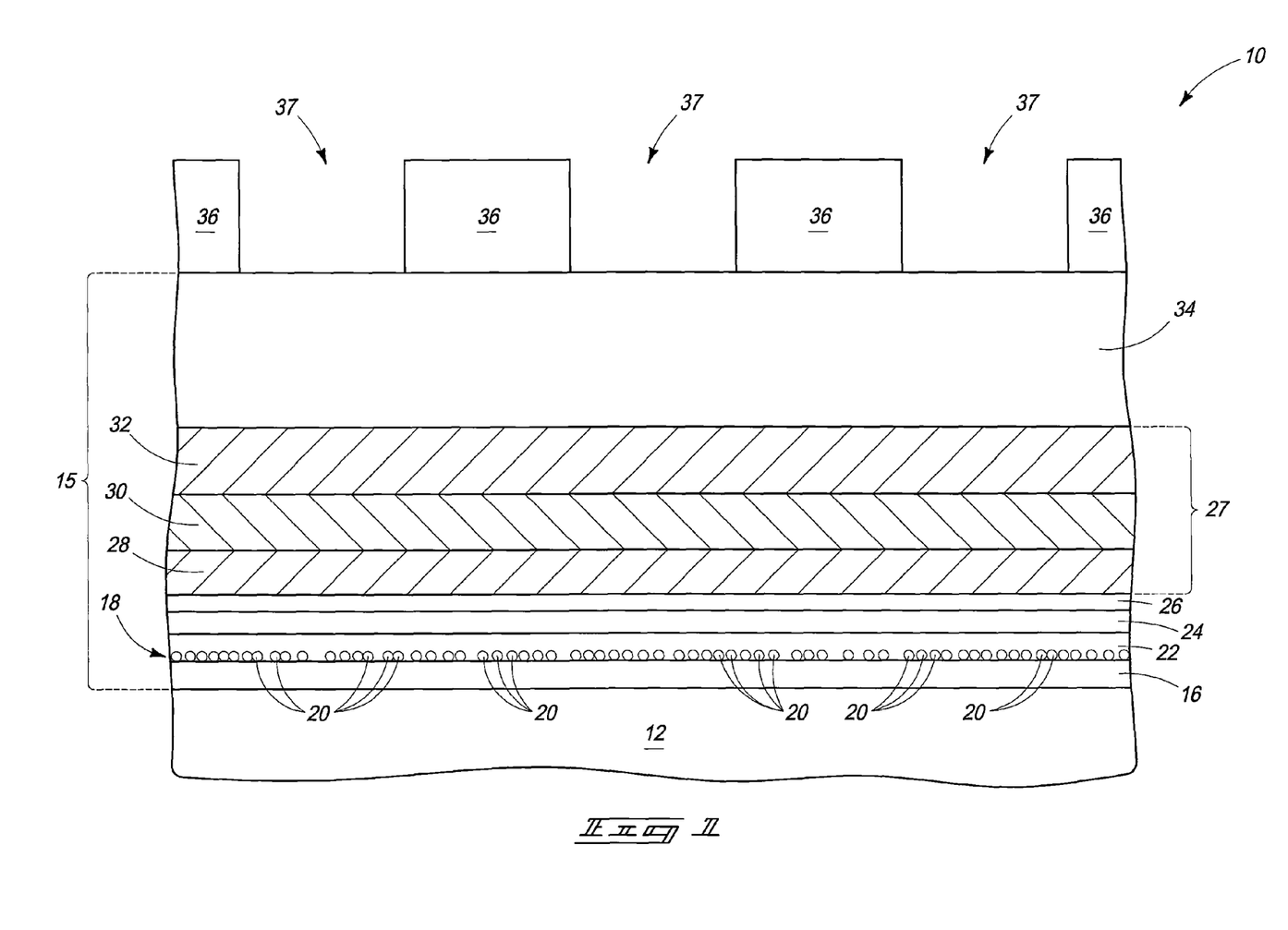
FIG. 1 is a diagrammatic sectional view of a substrate fragment in process of forming integrated circuitry in accordance with an embodiment of the invention.

Referring to FIG. 1, a substrate fragment in process in accordance with an embodiment of the invention is indicated generally with reference numeral 10 and may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Example substrate 10 includes semiconductive material 12 which may comprise, consists essentially of, or consists of, for example, monocrystalline silicon lightly-doped with background p-type dopant. A series of materials has been formed over semiconductive material 12, and constitutes an example gate stack 15.

Specifically, a dielectric material 16 which will function as tunnel dielectric has been deposited over semiconductive material 12. Any existing or yet-to-be developed material is contemplated, with silicon dioxide being an example. An example thickness is about 75 Angstroms. Tunnel dielectric 16 may be homogenous or non-homogenous, for example comprising multiple different composition dielectric layers.

Charge storage material 18 has been formed over tunnel dielectric 16. Such may be continuous or discontinuous. A discontinuous charge storing material 18 is shown, for example as constituting metallic nanoparticles 20. Examples include noble metals such as ruthenium, rhodium, palladium, silver, osmium, iridium, platinum, and gold. Other materials may be used, including any combination of these and other materials. The depicted example metallic nanoparticles may have any suitable size and configuration. For example, such nanoparticles may be substantially spherical having diameters of from about 10 Angstroms to about 200 Angstroms, with 50 Angstroms being a specific example. Individual nanoparticles may be single grains of metallic material or may be clusters of metallic material, and may be formed using any existing or yet-to-be developed methods. Regardless, such constitute but one example charge storage material which alone or in combination with material thereover will be used in forming a charge storage portion of a programmable charge storage transistor gate.

A high-k dielectric 22 has been formed over charge storage material 18. In the context of this document, "high-k" constitutes "k" of at least 5.0. Where charge storage material 18 is discontinuous as shown, high-k dielectric 22 may be formed over and between discontinuous portions of charge storage material 18 and in contact with tunnel dielectric 16. High-k dielectric 22 may be homogenous or non-homogenous. In one embodiment, such is an oxide-comprising high-k dielectric and in one embodiment comprises metal oxide. In one embodiment, such contains hafnium, with specific examples being hafnium oxide or hafnium silicon oxide. By way of examples only, others include zirconium oxide, zirconium silicon oxide, aluminum oxide, lanthanum oxide and lanthanum silicon oxide. An example thickness range for high-k dielectric 22 above nanoparticles 20 is from about 20 Angstroms to about 25 Angstroms. In one embodiment, nanoparticles 20 and high-k dielectric 22 in combination may be considered as comprising charge-storage material of the charge storage transistor gate lines being fabricated.

Dielectric materials 24 and 26 have been formed over high-k dielectric 22. Such may be homogenous or non-homogenous, with an example thickness for material 24 being 60 Angstroms and that for material 26 being 50 Angstroms. In one embodiment, each of dielectrics 22, 24, and 26 contains oxygen, and in one embodiment each also contains silicon. By ways of example only, an example dielectric material 24 is high temperature thermally deposited silicon dioxide. An example dielectric material 26 is a high-k hafnium-containing oxide dielectric, for example hafnium silicon oxide which may be of the same or different composition from an example embodiment where dielectric 22 also comprises hafnium silicon oxide. In one embodiment where at least three dielectrics are received over tunnel dielectric 16, dielectric 22 may be considered as a first dielectric, dielectric 24 as a second dielectric, and dielectric 26 as a third dielectric.

Conductive control gate material 27 has been formed over high-k dielectric 22, and in the depicted embodiment over dielectrics 24 and 26. Control gate material 27 may or may not be homogenous. Examples include one or more conductive elemental metals, alloys of conductive elemental metals, conductive metal compounds, and conductively doped semiconductive materials. An example thickness for control gate material 27 is about 550 Angstroms, with such by way of example only being depicted as comprising three materials 28, 30, and 32 which individually may be homogenous or non-homogenous. In one embodiment, one of such materials comprises a conductive metal nitride and another of such materials comprises a conductive metal silicide. In one embodiment, materials 28 and 32 comprise one of a conductive metal nitride and the other a conductive metal silicide, with material 30 received therebetween comprising conductively doped polysilicon. In one embodiment, a conductive metal nitride is tantalum nitride and in one embodiment a conductive metal silicide is tungsten silicide.

A dielectric capping material 34 has been formed over control gate material 27, and a masking material 36 has been formed over capping material 34. Dielectric capping material 34 may be homogenous or non-homogenous, with silicon dioxide, silicon nitride, and silicon oxynitride being examples. Masking material 36 may be homogenous or non-homogenous, with photoresist and/or any suitable existing or yet-to-be developed hard-masking material being examples. One or more antireflective coatings may also be used. In one embodiment, masking material 36 may generally define an outline for charge storage transistor gate lines and/or locations of memory cells, and has a plurality of openings 37 extending there-through. Openings 37, at least in part, may be used to define spaces received between the gate lines and/or memory cells. Masking material 36 may be formed using pitch multiplication techniques whereby the width of material 36 and/or the spaces there-between are sub-lithographic.

Figure 2:
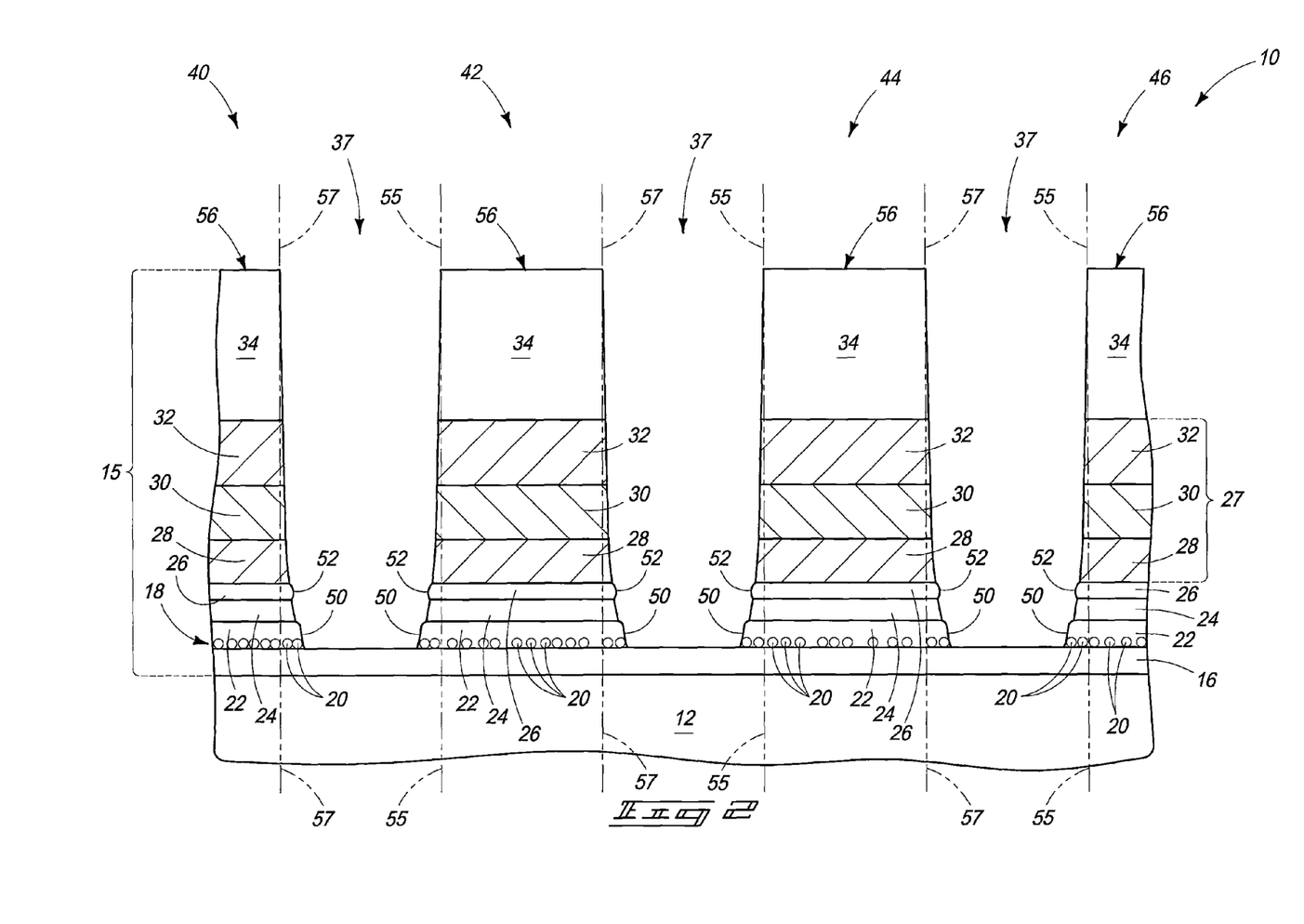
FIG. 2 is a view of the FIG. 1 substrate fragment at a processing step subsequent to that shown by FIG. 1.

Referring to FIG. 2, gate stack 15 has been etched at least to tunnel dielectric 16 to form a plurality of charge storage transistor gate lines 40, 42, 44, and 46 over semiconductive material 12 in the depicted cross section. Some, none or all of exposed tunnel dielectric 16 may also be etched. Regardless, some of the material of gate stack 15 may have been previously patterned. For example, charge storage material 18 may have been patterned in planes parallel to the page upon which FIG. 2 lies to define individual/isolated regions of such material.

Individual of gate lines 40, 42, 44, and 46 comprise laterally projecting feet 50 which comprise high-k dielectric 22. In one embodiment, charge storage material 18 is also within laterally projecting feet 50 over tunnel dielectric 16. The FIG. 2 construction may be formed using one or more suitable acts of etching using one or more suitable etching chemistries. In one embodiment, the etching of stack 15 to produce the FIG. 2 construction comprises dry plasma etching using the same chemical components to etch conductive control gate material 27 and high-k dielectric 22 but in different relative quantities of the chemical components. As an example, gate stack 15 may be dry plasma etched to produce the FIG. 2 construction using $BCl_3$ and at least one of $Cl_2$ and HBr as chemical components of etching, wherein the ratio of $BCl_3$ to the at least one of $Cl_2$ and HBr is varied to achieve a suitable rate of etching depending upon the material being etched. Alternately, by way of example, the same relative quantities of the chemical components may be used. For example, each of silicon dioxide, hafnium silicon oxide, tantalum nitride, tungsten silicide, and polysilicon may be dry plasma anisotropically etched using $BCl_3$ and at least one of $Cl_2$ and HBr at a volumetric ratio of 1:2 ($BCl_3$:$Cl_2$, $BCl_3$:HBr, or $BCl_3$: $Cl_2$+HBr) at a substrate temperature of 70° C. and chamber pressure of 5 mTorr.

In one embodiment and as shown, etching of gate stack 15 also forms individual gate lines 40, 42, 44 and 46 to comprise lateral projections 52 above laterally projecting feet 50. In one embodiment, lateral projections 52 are formed in or relative to dielectric material 26 received over high-k dielectric 22. Regardless, lateral projections 52 may be considered as projecting laterally relative to a pair of imaginary lines 55 and 57 which extend orthogonally from semiconductive material 12 through opposing lateral outermost edges of an uppermost surface 56 of the individual gate lines 40, 42, 44 and 46. Feet 50 may also be considered as projecting laterally relative to such lines.

Figure 3:
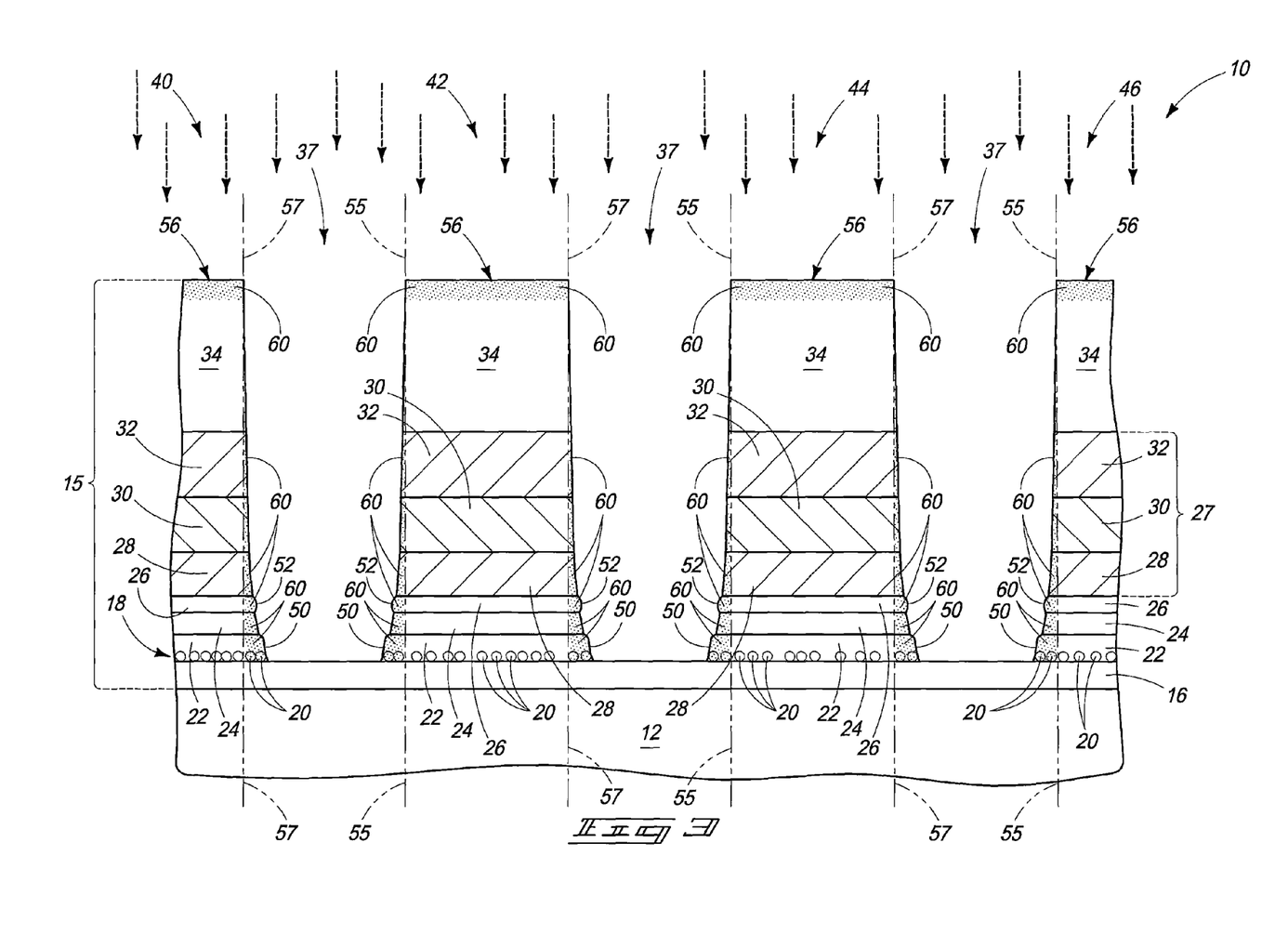
FIG. 3 is a view of the FIG. 2 substrate fragment at a processing step subsequent to that shown by FIG. 2.

Referring to FIG. 3, ions have been implanted into an implant region 60 which at least comprises high-k dielectric 22 of laterally projecting feet 50, with the implanted ions being chemically inert to high-k dielectric 22. Implant region 60 may be continuous (not shown) or discontinuous (as shown). By way of examples only, example inert ions are any one of argon, xenon, silicon, nitrogen, or any combination of two or more of argon, xenon, silicon, and nitrogen. Ideally, the implanting is conducted at a low energy, for example from 1 keV to 10 keV, with 5 keV being a specific example. Further, ideally the implant is conducted to a high dose, for example from $1\times10^{14}$ ions/cm$^2$ to $1\times10^{16}$ ions/cm$^2$, with $1\times10^{15}$ ions/cm$^2$ being a specific example. In one embodiment where for example lateral projection 52 above laterally projecting feet 50 have been formed, implant region 60 comprises such lateral projections 52. Regardless, some or all of lateral projections 52 and some or all of laterally projecting feet 50 may be encompassed by implant region 60. Ideally, the implant region encompasses all of such projections and feet to facilitate removal thereof in a selective etch described below.

Figure 4:
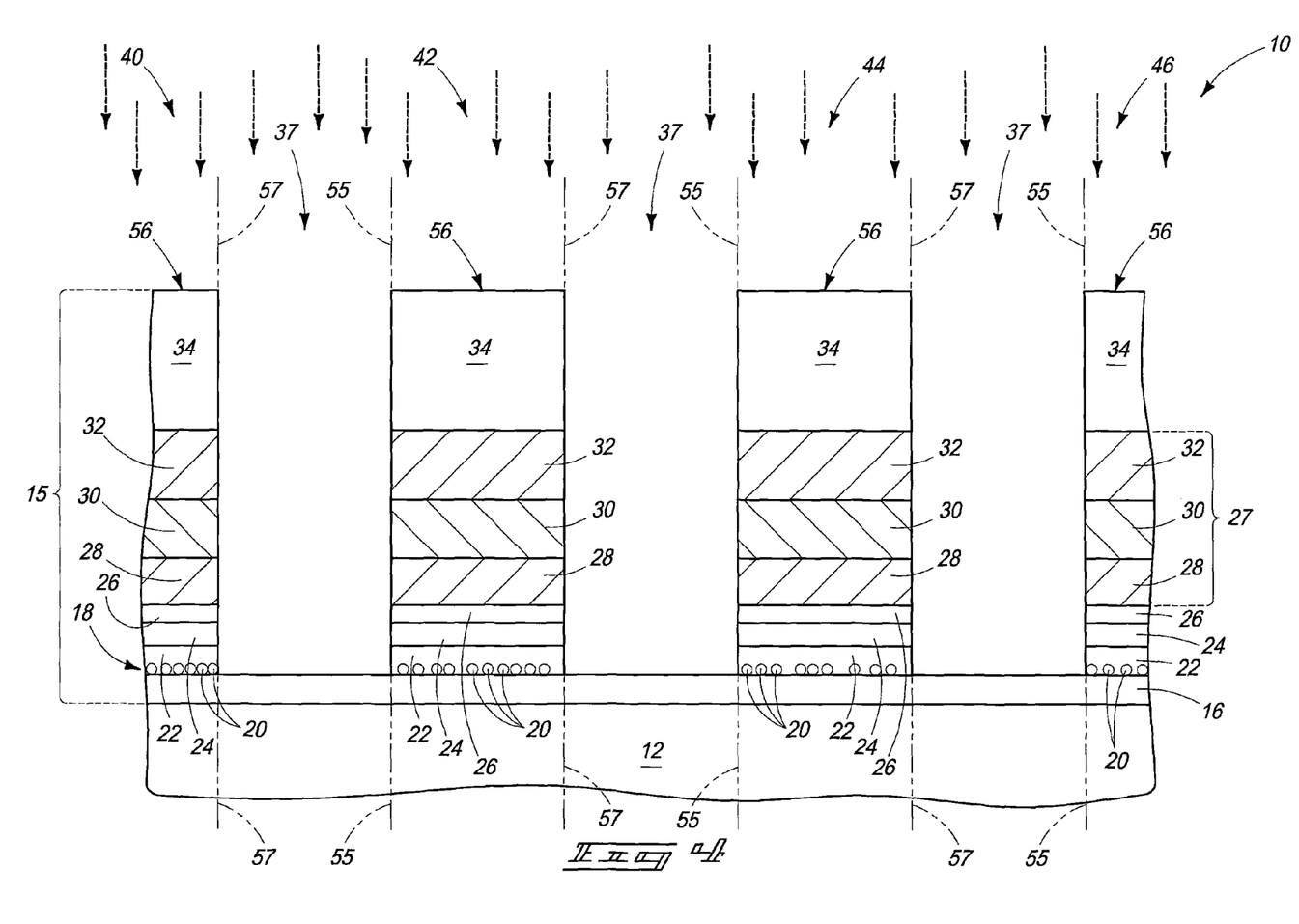
FIG. 4 is a view of the FIG. 3 substrate fragment at a processing step subsequent to that shown by FIG. 3.

Referring to FIG. 4, ion implanted high-k dielectric 22 of projecting feet 50 (not shown) has been etched selectively relative to portions of high-k dielectric 22 outside of implant region 60 (not shown). In one embodiment and as shown, all ion implanted material of implant region 60 (not shown) has been etched selectively relative to all material outside of implant region 60. In the context of this document, a selective etch requires etching of one material relative to another at a differential removal rate of at least 2:1. Substantially higher and near infinite selectivity for the time of etch of an implant region physically damaged by the implanted ions may be achieved. Accordingly and regardless, in one embodiment wherein lateral projections 52 are also included and implanted, such may be etched while etching the laterally projecting feet, and in one embodiment selectively relative to all material outside of implant region 60 (not shown).

A selective etching of ion implanted region 60 may comprise wet and/or dry etching. In one embodiment, an aqueous $H_3PO_4$-containing solution at a temperature of at least 100° C. may be used. For example, a phosphoric acid solution in a bath at atmospheric pressure from 130° C. to 165° C. may be used for from anywhere from 15 seconds to 5 minutes, with 60 seconds being a specific example. A specific example phosphoric acid solution is an 85% by volume of phosphoric acid in water, wherein said phosphoric acid is itself an 85% by volume solution of phosphoric acid in water. An alternate example wet etching chemistry includes an HF solution at a volumetric ratio of 100:1 $H_2O$:HF. An HF solution would be expected to etch selectively relative to a metal-containing high-k oxide dielectric, but not likely selectively relative to silicon dioxide not containing an additional elemental metal therein as part of the oxide. Regardless, the above example chemistries may obtain or result in isotropic etching.

An example dry isotropic etching chemistry comprises $BCl_3$ and at least one of $Cl_2$ and HBr, for example at a volumetric ratio of $BCl_3$ to at least one of $Cl_2$ and HBr of 10:1, at low bias power (i.e. 15-20 W), at a substrate temperature of 70° C., and at a chamber pressure from 10-20 mTorr.

Where the laterally projecting feet contain charge storage material 18/20, the etching described with reference to FIG. 4 may or may not etch away the charge storage material within the projecting feet while etching the ion implanted high-k dielectric of the projecting feet. FIG. 4 depicts an example whereby such charge storage material (not shown) has been so etched while etching the ion implanted high-k dielectric 22 of projecting feet 50 (not shown).

Figure 5:
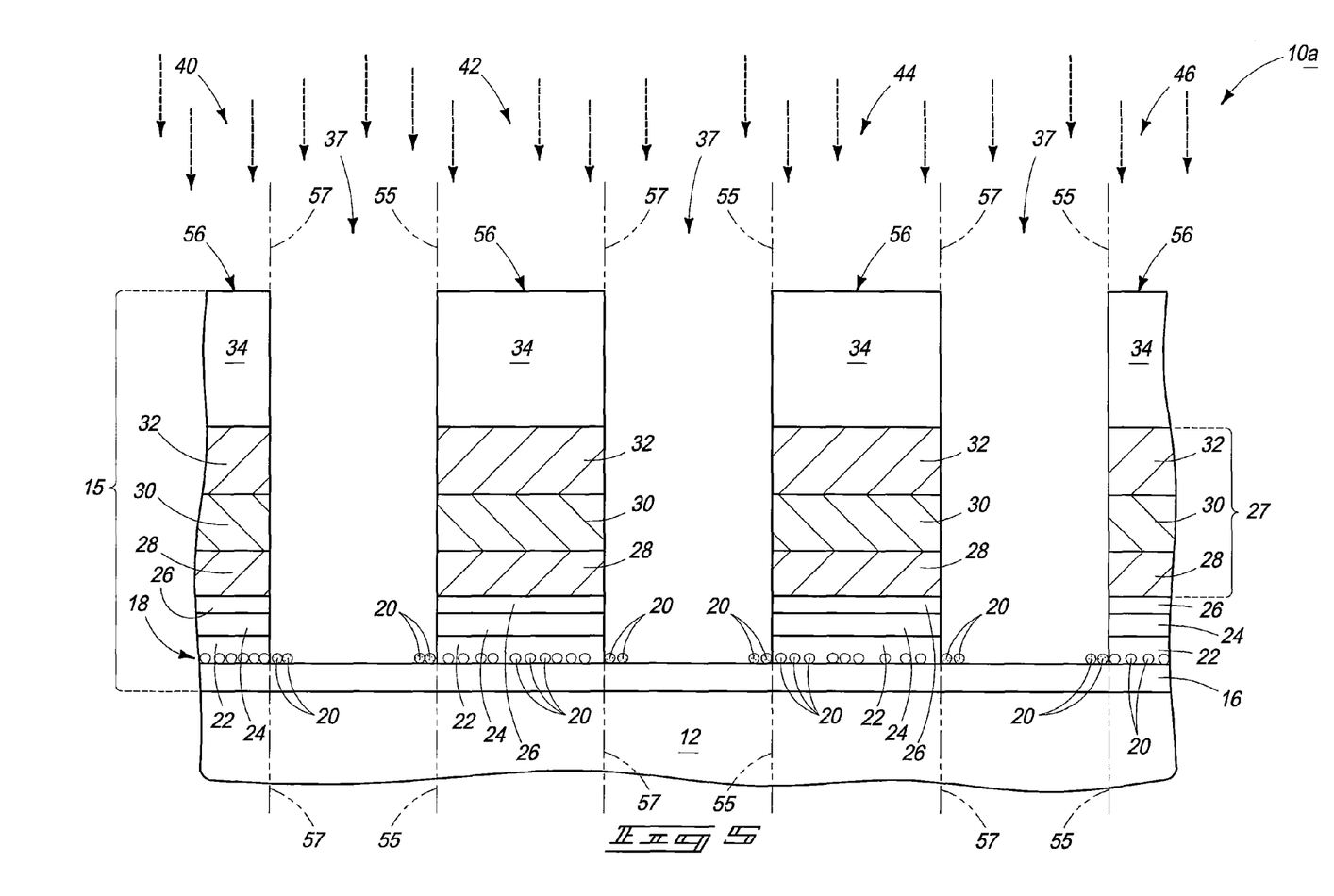
FIG. 5 is a diagrammatic sectional view of a substrate fragment in process of forming integrated circuitry in accordance with an embodiment of the invention, and is an alternate to the processing depicted by FIG. 4.
Figure 5B:
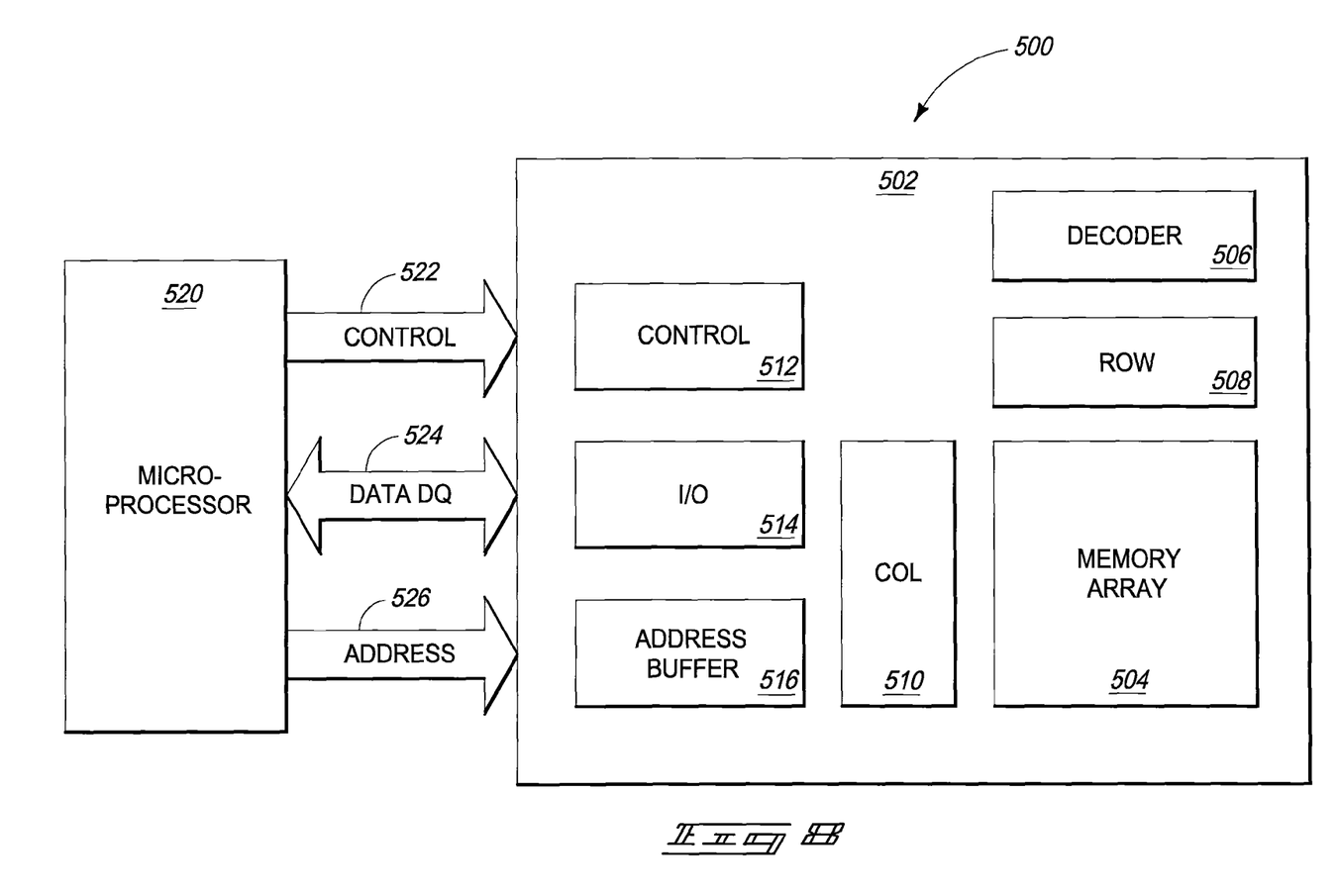

FIG. 5 depicts an alternate embodiment substrate fragment 10a. Like numerals from the above described embodiments have been used where appropriate, with differences being indicated with the suffix "a". In FIG. 5, the etching of the ion implanted high-k dielectric of the projecting feet has been conducted selectively relative to charge storage material 18/20 (which may or may not have been implanted) of the projecting feet. Such thereby leaves charge storage material 18/20 of the feet behind. In one embodiment where such occurs, charge storage material 18/20 of the projecting feet may be subsequently etched away, for example by exposing the FIG. 5 construction to suitable etching conditions to produce the construction of FIG. 4. As examples, noble metals might be wet etched in FIG. 5 to produce the construction of FIG. 4 using an aqueous solution comprising a combination of sulfuric acid and hydrogen peroxide. Alternately, by way of example, noble metals may be plasma etched using a chemistry comprising $CHCl_3$, $CO_2$, and $O_2$. Other chemistries, whether existing or yet-to-be developed, may be used.

Again referring to FIG. 2, such depicts an example embodiment wherein gate stack 15 has been etched in such a manner that charge storage material 18 has been removed from being received over tunnel dielectric 16 between projecting feet 50 of immediately adjacent of the gate lines. Alternately, such etching may leave some or all of charge storage material 18/20 over tunnel dielectric 16 between projecting feet 50 of immediately adjacent of the gate lines. Such is shown for example in FIG. 6 with respect to a substrate fragment 10b. Like numerals from the above described embodiments have been used where appropriate, with differences being indicated with the suffix "b". In one embodiment, such charge storage material 18/20 between the projecting feet 50 of immediately adjacent gate lines may be etched away while etching the ion implanted high-k dielectric of the projecting feet.

Alternately, where the etching of the ion implanted high-k dielectric of the projecting feet is conducted selectively relative to the charge storage material, charge storage material may as well be left behind between the projecting feet of immediately adjacent gate lines. Such is shown for example with respect to a substrate fragment 10c in FIG. 7. Like numerals from the above-described embodiment have been used where appropriate, with differences being indicated with the suffix "c". In one such embodiment, such charge storage material of the projecting feet and that received between the projecting feet of immediately adjacent of the gate lines may be subsequently etched away, for example to transform the construction of FIG. 7 to that of FIG. 4.

An embodiment of the invention encompasses a method of forming integrated circuitry including any of the gate stacks, for example, as shown and described above in connection with FIG. 1. In one embodiment, such gate stack is etched at least to the tunnel dielectric to form a plurality of charge storage transistor gate lines over semiconductive material. Individual of such gate lines comprise opposing lateral projections of greater degree of lateral projecting proximal to tunnel dielectric than distal the tunnel dielectric. For example and by way of example only, feet 50 as shown above project laterally outward to a greater degree than that of projections 52, and wherein feet 50 are more proximal tunnel dielectric 16 than are lateral projections 52. Ions which are chemically inert to the material of the lateral projections are implanted into such lateral projections. Thereafter, material of the ion implanted lateral projections is etched selectively relative to material of the gate stack which has not been so ion implanted after the etching of the stack to form the gate lines.

Charge storage transistors fabricated in accordance with any of the above embodiments may be used in any existing or yet-to-be-developed integrated circuitry, for example in flash memory. A typical flash memory comprises a memory array that includes a large number of memory cells arranged in row and column fashion. The cells are usually grouped into blocks. Each of the cells within a block may be electrically programmed by charging an individual charge storage structure. The charge may be removed from the charge storage structure by a block erase operation. Data is stored in a cell as charge in the charge storage structure.

NAND is a basic architecture of existing flash memory. A NAND comprises at least one select gate coupled in series to a serial combination of memory cells.

FIG. 8 is a simplified block diagram of a memory system 500. The memory system includes an integrated circuit flash memory device 502 (e.g., a NAND memory device), that includes an array of memory cells 504, an address decoder 506, row access circuitry 508, column access circuitry 510, control circuitry 512, input/output (I/O) circuitry 514, and an address buffer 516. Memory system 500 also includes an external microprocessor 520, or other memory controller, electrically connected to memory device 502 for memory accessing as part of an electronic system. The memory device 502 receives control signals from the processor 520 over a control link 522. The memory cells are used to store data that is accessed via a data (DQ) link 524. Address signals are received via an address link 526, and are decoded at address decoder 506 to access the memory array 504. Address buffer circuit 516 latches the address signals. The memory cells may be accessed in response to the control signals and the address signals.

Figure 9:
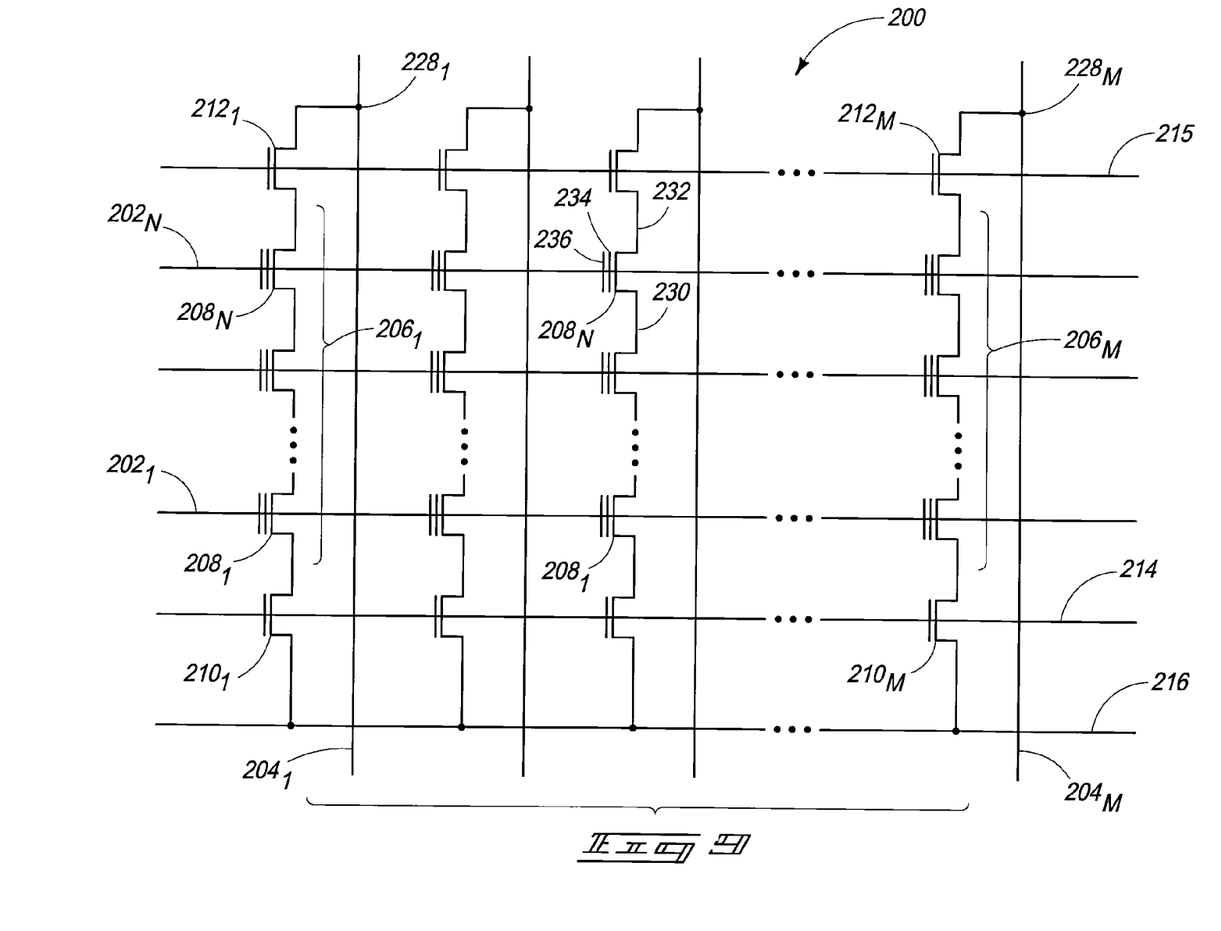
FIG. 9 a schematic of a NAND memory array in accordance with an embodiment.
Figure 11:
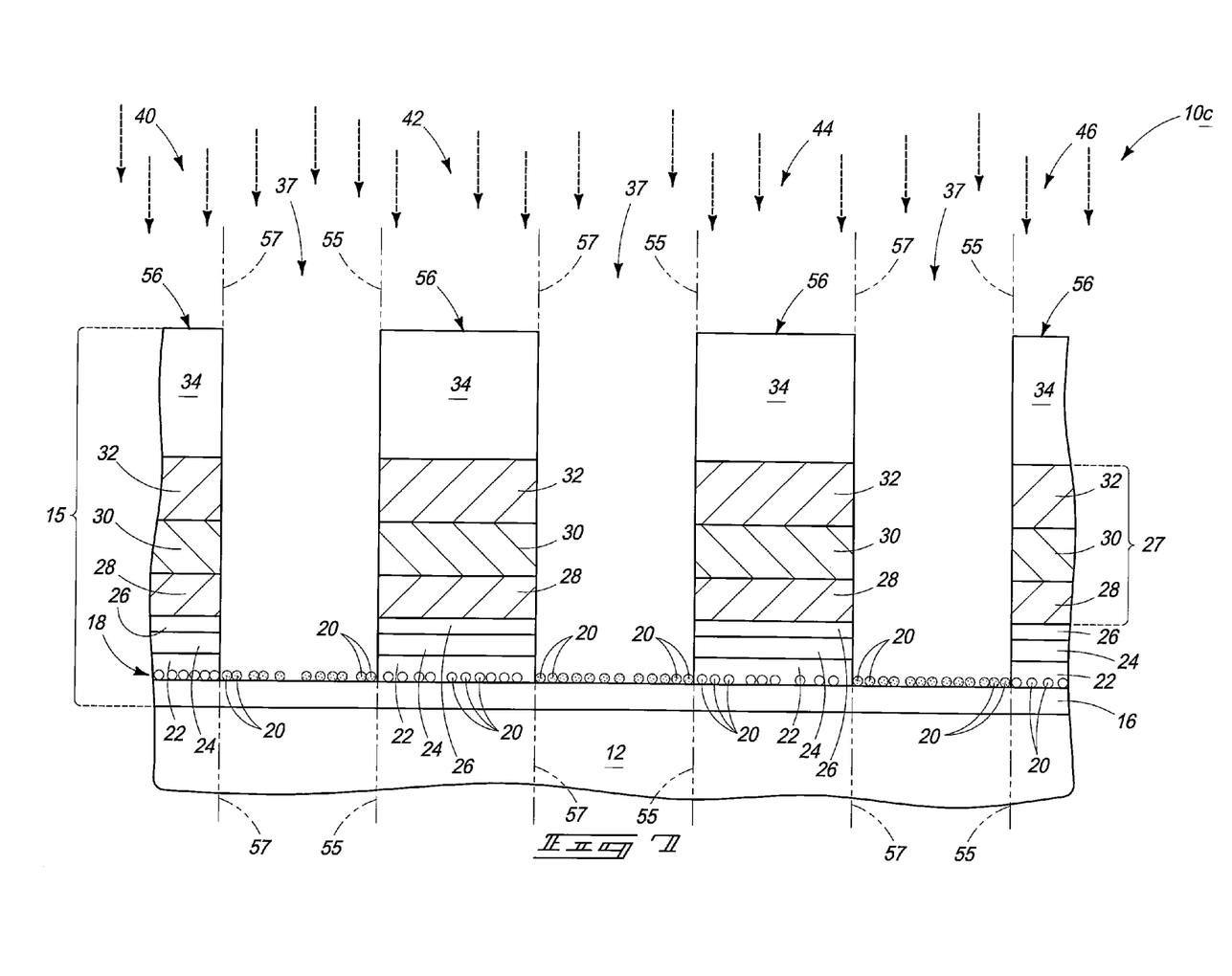

FIG. 9 is a schematic of a NAND memory array 200. Such may be a portion of memory array 504 of FIG. 8. Memory array 200 includes wordlines $202_1$ to $202_N$, and intersecting local bitlines $204_1$ to $204_M$. The number of wordlines 202 and the number of bitlines 204 may be each some power of two, for example, 256 wordlines and 4,096 bitlines. The local bitlines 204 may be coupled to global bitlines (not shown) in a many-to-one relationship.

Memory array 200 includes NAND strings $206_1$ to $206_M$. Each NAND string includes charge-storage transistors $208_1$ to $208_N$. The charge-storage transistors may use, for example, floating gate material to store charge, or may use charge-trapping material (such as, for example, metallic nanodots) to store charge.

The charge-storage transistors 208 represent non-volatile memory cells for storage of data. The charge-storage transistors 208 of each NAND string 206 are connected in series source to drain between a source select gate 210 and a drain select gate 212. Each source select gate 210 is located at an intersection of a local bitline 204 and a source select line 214, while each drain select gate 212 is located at an intersection of a local bitline 204 and a drain select line 215.

A source of each source select gate 210 is connected to a common source line 216. The drain of each source select gate 210 is connected to the source of the first charge-storage transistor 208 of the corresponding NAND string 206. For example, the drain of source select gate $210_1$ is connected to the source of charge-storage transistor $208_1$ of the corresponding NAND string $206_1$. The source select gates 210 are connected to source select line 214.

The drain of each drain select gate 212 is connected to a local bitline 204 for the corresponding NAND string at a drain contact 228. For example, the drain of drain select gate $212_1$ is connected to the local bitline $204_1$ for the corresponding NAND string $206_1$ at drain contact $228_1$. The source of each drain select gate 212 is connected to the drain of the last charge-storage transistor 208 of the corresponding NAND string 206. For example, the source of drain select gate $212_1$ is connected to the drain of charge-storage transistor $208_N$ of the corresponding NAND string $206_1$.

Charge-storage transistors 208 include a source 230, a drain 232, a charge storage structure 234, and a control gate 236. Charge-storage transistors 208 have their control gates 236 coupled to a wordline 202. A column of the charge-storage transistors 208 are those transistors within a NAND string 206 coupled to a given local bitline 204. A row of the charge-storage transistors 208 are those transistors commonly coupled to a given wordline 202.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming integrated circuitry, comprising:
    forming a charge storage transistor gate stack over semiconductive material; the stack comprising a tunnel dielectric, charge storage material over the tunnel dielectric, a high-k dielectric over the charge storage material, and conductive control gate material over the high-k dielectric;
    etching the stack at least to the tunnel dielectric to form a plurality of charge storage transistor gate lines over the semiconductive material, individual of the gate lines comprising laterally projecting feet comprising the high-k dielectric;
    after etching the stack to form the gate lines, implanting ions into an implant region comprising the high-k dielectric of the laterally projecting feet, the ions being chemically inert to the high-k dielectric; and
    etching the ion implanted high-k dielectric of the projecting feet selectively relative to portions of the high-k dielectric outside of the implant region.

2. The method of claim 1 wherein the etching of the stack comprises dry plasma etching using the same chemical components to etch the conductive control gate material and the high-k dielectric but in different relative quantities of the chemical components.

3. The method of claim 1 wherein the ions are any one of argon, xenon, silicon, and nitrogen, or any combination of two or more of argon, xenon, silicon, and nitrogen.

4. The method of claim 1 wherein the etching of the ion implanted projecting feet comprises wet etching.

5. The method of claim 4 wherein the high-k dielectric comprises metal oxide, and the wet etching comprises using an $H_3PO_4$-containing solution at a temperature of at least 100° C.

6. The method of claim 1 wherein the etching of the ion implanted projecting feet comprises dry etching.

7. The method of claim 1 wherein the etching of the stack forms the individual gate lines to comprise lateral projections above the projecting feet, said lateral projections projecting laterally relative to a pair of lines extending orthogonally from the semiconductive material through opposing lateral outermost edges of an uppermost surface of the individual gate lines, the implant region comprising the lateral projections above the projecting feet, and comprising:
    etching the ion implanted lateral projections above the projecting feet while etching the projecting feet.

8. The method of claim 7 comprising etching the ion implanted lateral projections selectively relative to all material outside of the implant region.

9. The method of claim 1 wherein the etching to at least the tunnel dielectric to form the gate lines leaves charge storage material over the tunnel dielectric within the projecting feet, and comprising:
    etching away the charge storage material within the projecting feet while etching the ion implanted high-k dielectric of the projecting feet.

10. The method of claim 1 wherein the etching to at least the tunnel dielectric to form the gate lines leaves charge storage material over the tunnel dielectric within the projecting feet, the etching of the ion implanted high-k dielectric of the projecting feet being conducted selectively relative to the charge storage material of the projecting feet and thereby leaving behind charge storage material of the projecting feet; and comprising:
    subsequently etching away the charge storage material of the projecting feet.

11. The method of claim 1 wherein the etching to at least the tunnel dielectric to form the gate lines leaves charge storage material over the tunnel dielectric between the projecting feet of immediately adjacent of the gate lines, and comprising:

etching away the charge storage material between the projecting feet of immediately adjacent of the gate lines while etching the ion implanted high-k dielectric of the projecting feet.

12. The method of claim 1 wherein the etching to at least the tunnel dielectric to form the gate lines leaves charge storage material over the tunnel dielectric within the projecting feet and leaves charge storage material over the tunnel dielectric between the projecting feet of immediately adjacent of the gate lines, the etching of the ion implanted high-k dielectric of the projecting feet being conducted selectively relative to the charge storage material and thereby leaving behind charge storage material of the projecting feet and between the projecting feet of immediately adjacent of the gate lines; and comprising:

subsequently etching away the charge storage material of the projecting feet and between the projecting feet of immediately adjacent of the gate lines.

13. A method of forming integrated circuitry, comprising:
forming a charge storage transistor gate stack over semiconductive material; the stack comprising a tunnel dielectric, charge storage material over the tunnel dielectric, a high-k dielectric over the charge storage material, and conductive control gate material over the high-k dielectric;
etching the stack at least to the tunnel dielectric to form a plurality of charge storage transistor gate lines over the semiconductive material, individual of the gate lines comprising opposing lateral projections of greater degree of projecting proximal the tunnel dielectric than distal the tunnel dielectric, the lateral projections projecting laterally relative to a pair of lines extending orthogonally from the semiconductive material through opposing lateral outermost edges of an uppermost surface of the individual gate lines;
after etching the stack to form the gate lines, implanting ions into the lateral projections, the ions being chemically inert to the material of the lateral projections; and
etching material of the ion implanted lateral projections selectively relative to material of the gate stack which has not been so ion implanted after the etching of the stack to form the gate lines.

14. The method of claim 13 comprising forming the charge storage transistor gate stack to comprise another dielectric over high-k dielectric, the lateral projections being of at least the high-k dielectric and the another dielectric and of greater projecting degree of the high-k dielectric than the another dielectric.

15. A method of forming integrated circuitry, comprising:
forming a charge storage transistor gate stack over semiconductive material; the stack comprising a tunnel dielectric, charge storage material over the tunnel dielectric, a first high-k hafnium-containing oxide dielectric over the charge storage material, a second oxide dielectric over the first high-k oxide dielectric, a third high-k hafnium-containing oxide dielectric over the second oxide dielectric, and conductive control gate material over the third high-k dielectric, the conductive control gate material comprising a conductive metal nitride and a conductive metal silicide;
dry plasma etching each of the control gate material, the third dielectric, the second dielectric, and the first dielectric of the gate stack at least to the tunnel dielectric using $BCl_3$ and at least one of $Cl_2$ and HBr as chemical components to form a plurality of charge storage transistor gate lines over the semiconductive material, individual of the gate lines comprising laterally projecting feet comprising the first high-k hafnium-containing oxide dielectric;
after etching the stack to form the gate lines, implanting ions into an implant region comprising the first high-k hafnium-containing dielectric of the laterally projecting feet, the ions being chemically inert to the first high-k hafnium-containing oxide dielectric; and
etching the ion implanted first high-k hafnium-containing dielectric of the projecting feet selectively relative to portions of the first high-k hafnium-containing dielectric outside of the implant region.

16. The method of claim 15 wherein $Cl_2$ is used in the dry plasma etching to form the gate lines.

17. The method of claim 16 wherein $Cl_2$ is used in the dry plasma etching of each of the control gate material, the third dielectric, the second dielectric, and the first dielectric to form the gate lines.

18. The method of claim 15 wherein HBr is used in the dry plasma etching to form the gate lines.

19. The method of claim 18 wherein $Cl_2$ is used in the dry plasma etching of each of the control gate material, the third dielectric, the second dielectric, and the first dielectric to form the gate lines.

20. The method of claim 15 wherein the conductive control gate material comprises conductively doped polysilicon received between the conductive metal nitride and the conductive metal silicide, the conductively doped polysilicon being dry plasma etched using $BCl_3$ and at least one of $Cl_2$ and HBr as chemical components in forming the gate lines.

21. The method of claim 15 wherein the first, second, and third oxide dielectrics each contain silicon.

22. The method of claim 15 wherein the metal nitride comprises tantalum nitride.

23. The method of claim 15 wherein the metal silicide comprises tungsten silicide.

* * * * *

UNITED STATES PATENT AND TRADEMARK OFFICE
CERTIFICATE OF CORRECTION

PATENT NO.       : 8,173,507 B2
APPLICATION NO.  : 12/820214
DATED            : May 8, 2012
INVENTOR(S)      : Chan Lim et al.

Page 1 of 1

It is certified that error appears in the above-identified patent and that said Letters Patent is hereby corrected as shown below:

On the Title page, in "Primary Examiner", in column 2, line 1, delete "Savitr" and insert -- Savitri --, therefor.

Signed and Sealed this
Tenth Day of July, 2012

David J. Kappos
*Director of the United States Patent and Trademark Office*